(12) United States Patent
Seo et al.

(10) Patent No.: US 12,190,958 B2
(45) Date of Patent: Jan. 7, 2025

(54) STORAGE CONTROLLER AND STORAGE DEVICE INCLUDING THE SAME

(71) Applicant: Samsung Electronics Co., Ltd., Suwon-si (KR)

(72) Inventors: Jun-Ho Seo, Hwaseong-si (KR); Sang Yong Yoon, Seoul (KR); Min Soo Kim, Uiwang-si (KR); Jeong Hoon Nam, Seoul (KR); Hyeon Su Bak, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 182 days.

(21) Appl. No.: 17/956,225

(22) Filed: Sep. 29, 2022

(65) Prior Publication Data

US 2023/0162799 A1   May 25, 2023

(30) Foreign Application Priority Data

Nov. 22, 2021   (KR) .................. 10-2021-0160942

(51) Int. Cl.
| | |
|---|---|
| G11C 5/00 | (2006.01) |
| G11C 16/14 | (2006.01) |
| G11C 16/26 | (2006.01) |

(52) U.S. Cl.
CPC ............. *G11C 16/14* (2013.01); *G11C 16/26* (2013.01)

(58) Field of Classification Search
CPC .......... G11C 16/14; G11C 16/26; G11C 7/04; G11C 11/5635; G11C 11/5642; G11C 16/349; G11C 16/0483; G11C 16/16; G11C 16/08; G11C 16/24; G11C 29/42; G11C 16/10; G06N 20/00

USPC .......................................................... 365/52
See application file for complete search history.

(56) References Cited

U.S. PATENT DOCUMENTS

| | | | |
|---|---|---|---|
| 7,366,020 B2* | 4/2008 | Choi ................. | G11C 16/16 365/185.24 |
| 7,460,403 B2* | 12/2008 | Lee .................... | G11C 16/3427 365/185.23 |
| 7,679,133 B2 | 3/2010 | Son et al. | |
| 7,817,467 B2 | 10/2010 | Roohparvar et al. | |
| 8,023,323 B2 | 9/2011 | Kang et al. | |
| 8,553,466 B2 | 10/2013 | Han et al. | |
| 8,559,235 B2 | 10/2013 | Yoon et al. | |

(Continued)

*Primary Examiner* — Tha-O H Bui
(74) *Attorney, Agent, or Firm* — Harness, Dickey & Pierce, P.L.C.

(57) ABSTRACT

A storage device and an operating method of the storage device are provided. The storage device comprises a first non-volatile memory device, a second non-volatile memory device, a third non-volatile memory device a storage controller configured to control the first non-volatile memory device, the second non-volatile memory device, and the third non-volatile memory device, control the first non-volatile memory device to extract a first on-cell count value after a first soft erase operation, set first to third read level offsets of the respective first to third non-volatile memory devices based on the respective first to third on-cell count values, select the first to third defense code parameter sets each corresponding to the respective first to third read level offsets, and transmits first to third read commands based on the selected respective first to third defense code parameter sets to the respective first to third non-volatile memory devices.

20 Claims, 12 Drawing Sheets

(56) References Cited

U.S. PATENT DOCUMENTS

| | | |
|---|---|---|
| 8,654,587 B2 | 2/2014 | Yoon et al. |
| 9,576,671 B2 | 2/2017 | Karakulak et al. |
| 9,720,754 B2 * | 8/2017 | Karakulak ............ G06F 11/073 |
| 9,852,804 B2 | 12/2017 | Park et al. |
| 10,056,152 B2 | 8/2018 | Hahn et al. |
| 10,157,674 B2 * | 12/2018 | Kim ....................... G11C 16/16 |
| 10,289,341 B2 | 5/2019 | Kirshenbaum et al. |
| 10,566,061 B2 | 2/2020 | Karakulak et al. |
| 10,573,389 B2 | 2/2020 | Kim et al. |
| 10,734,082 B2 | 8/2020 | Lee et al. |
| 10,892,025 B2 * | 1/2021 | Banerjee ............. G06F 13/1668 |
| 10,949,105 B2 | 3/2021 | Koo et al. |
| 2011/0233648 A1 | 9/2011 | Seol et al. |
| 2019/0279724 A1 | 9/2019 | Itoh et al. |
| 2020/0402580 A1 | 12/2020 | Kim et al. |
| 2021/0166774 A1 | 6/2021 | Cha et al. |

\* cited by examiner

FIG. 13

PDT Parameter (Read Level Offset)

| State [mV] | Group1 | Group2 | Group3 |
|---|---|---|---|
| R1 | 0 | 0 | 0 |
| R2 | 20 | 20 | 20 |
| R3 | 20 | 20 | 20 |
| R4 | 0 | 0 | 0 |
| R5 | -10 | -10 | -10 |
| R6 | -10 | -10 | -10 |
| R7 | -10 | -10 | -10 |
| R8 | -10 | -10 | -10 |
| R9 | -20 | -20 | -20 |
| R10 | -30 | -40 | -40 |
| R11 | -30 | -40 | -50 |
| R12 | -40 | -50 | -60 |
| R13 | -50 | -60 | -80 |
| R14 | -60 | -70 | -100 |
| R15 | -70 | -90 | -120 |

FIG. 14

PDT Parameter (Read Level Offset)

| State [mV] | Group1 || Group2 ||| Group3 |||
|---|---|---|---|---|---|---|---|---|
| | WL3~16 | WL17~40 | WL41~90 | WL3~16 | WL17~50 | WL51~90 | WL3~16 | WL17~40 | WL41~90 |
| R1 | 0 | 0 | 0 | 0 | 0 | 0 | 0 | 0 | 0 |
| R2 | 20 | 20 | 20 | 20 | 20 | 20 | 20 | 20 | 20 |
| R3 | 20 | 20 | 20 | 20 | 20 | 20 | 20 | 20 | 20 |
| R4 | 0 | 0 | 0 | 0 | 0 | 0 | 0 | 0 | 0 |
| R5 | -10 | -10 | -10 | -10 | -10 | -10 | -10 | -10 | -10 |
| R6 | -10 | -10 | -10 | -10 | -10 | -10 | -10 | -10 | -10 |
| R7 | -10 | -10 | -10 | -10 | -10 | -10 | -10 | -10 | -10 |
| R8 | -10 | -10 | -10 | -10 | -10 | -10 | -10 | -10 | -10 |
| R9 | -20 | -20 | -20 | -20 | -20 | -20 | -20 | -20 | -20 |
| R10 | -30 | -30 | -30 | -40 | -40 | -40 | -40 | -40 | -40 |
| R11 | -30 | -40 | -40 | -50 | -50 | -50 | -50 | -60 | -60 |
| R12 | -40 | -50 | -40 | -60 | -60 | -50 | -60 | -70 | -60 |
| R13 | -50 | -70 | -60 | -70 | -80 | -70 | -80 | -100 | -90 |
| R14 | -60 | -80 | -70 | -90 | -90 | -80 | -100 | -120 | -100 |
| R15 | -70 | -100 | -80 | -120 | -120 | -100 | -120 | -150 | -130 |

STORAGE CONTROLLER AND STORAGE DEVICE INCLUDING THE SAME

CROSS-REFERENCE TO RELATED APPLICATION

This application claims priority from Korean Patent Application No. 10-2021-0160942 filed on Nov. 22, 2021 in the Korean Intellectual Property Office, and all the benefits accruing therefrom under 35 U.S.C. 119, the contents of which in their entirety are herein incorporated by reference.

BACKGROUND

1. Technical Field

The present disclosure relates to a storage controller and a storage device including the same.

2. Description of the Related Art

As speeds of electronic devices increase and as electric power of the electronic devices decreases, storage devices embedded in the electronic devices are more advantageous with faster read/write operations and lower operation voltages. In memory devices included in the storage device, a change in optimal read voltage level occurs according to a retention degree for each of chips on which the memory devices are disposed. One of the main causes of such a change in optimal read voltage level may be a degree of the deformity of a channel hole of a memory cell array.

SUMMARY

Example embodiments of the present disclosure provide a storage device with improved operation performance.

Example embodiments of the present disclosure also provide a storage device with improved operation performance by differently applying data retention characteristics to each chip.

Example embodiments of the present disclosure also provide a storage device with improved data reliability by applying different defense code parameters according to data retention characteristics and performing an operation.

One example embodiment of the present disclosure provides a storage device comprising a first non-volatile memory device, a second non-volatile memory device, a third non-volatile memory device, and a storage controller configured to control the first non-volatile memory device, the second non-volatile memory device, and the third non-volatile memory device, control the first non-volatile memory device to extract a first on-cell count value after a first soft erase operation, control the second non-volatile memory device to extract a second on-cell count value after a second soft erase operation, and control the third non-volatile memory device to extract a third on-cell count value after a third soft erase operation, select the respective first to third defense code parameter sets each corresponding to the respective first to third read level offsets, and transmits first to third read commands based on the selected respective first to third defense code parameter sets to the respective first to third non-volatile memory devices.

Another example embodiment of the present disclosure provides a storage device comprising a first non-volatile memory device having first health index information, a second non-volatile memory device having second health index information and a storage controller configured to read first data of the first non-volatile memory device by a first read command including a first defense code parameter set based on the first health index information and read second data of the second non-volatile memory device by a second read command including a second defense code parameter set based on the second health index information, wherein a first read level offset of the first non-volatile memory device is different from a second read level offset of the second non-volatile memory device.

Other example embodiment of the present disclosure provides a storage device comprising a first non-volatile memory device and a second non-volatile memory device, the first non-volatile memory device including a first normal memory block and a first security block, the first security block storing first health index information, and the second non-volatile memory device including a second normal memory block and a second security block, the second security block storing second health index information and a storage controller configured to read data of the first non-volatile memory device by applying a first pre-defined read level offset table (PDT) based on the first health index information and read data of the second non-volatile memory device by applying a second PDT based on the second health index information.

Other example embodiment of the present disclosure provides a storage device comprising a first non-volatile memory device on a first chip, a second non-volatile memory device on a second chip and a storage controller on a third chip, the storage controller being configured to perform read-retry on the first non-volatile memory device and the second non-volatile memory device, wherein a read level offset for the read-retry is determined by determining a first read level offset for the first non-volatile memory device is set based on a first machine learning parameter for the first chip and determining a second read level offset for the second non-volatile memory device is set based on a second machine learning parameter for the second chip.

Other example embodiment of the present disclosure provides an operation method of a storage device, comprising: transmitting a normal read command to a first non-volatile memory device, by a storage controller, extracting an off-cell count value by performing a soft erase operation, by the first non-volatile memory device, in response to the first non-volatile memory device failing in data read, the data read corresponding to the normal read command, selecting a defense code parameter set corresponding to the off-cell count value among a plurality of defense code parameter sets and transmitting a read-retry command including the selected defense code parameter set, by the storage controller, storing environment information on the first non-volatile memory device in response to the first non-volatile memory device passing in the data read according to the read-retry command, machine-learning an improved read level offset for the first non-volatile memory device based on the environment information and applying the improved read level offset to a read level in a subsequent read operation.

However, example embodiments of the present disclosure are not restricted to those set forth herein. The above and other example embodiments of the present disclosure will become more apparent to one of ordinary skill in the art to which the present disclosure pertains by referencing the detailed description of the present disclosure given below.

BRIEF DESCRIPTION OF THE DRAWINGS

The above and other example embodiments and features of the present disclosure will become more apparent by describing in detail example embodiments thereof with reference to the attached drawings, in which:

FIGS. 13 and 14 are tables illustrating a pre-defined table (PDT) parameter according to some example embodiments.

DETAILED DESCRIPTION OF THE EXAMPLE EMBODIMENTS

Hereinafter, memory devices according to some example embodiments of the present disclosure will be described with reference to FIGS. 1 to 18.

Figure 1:
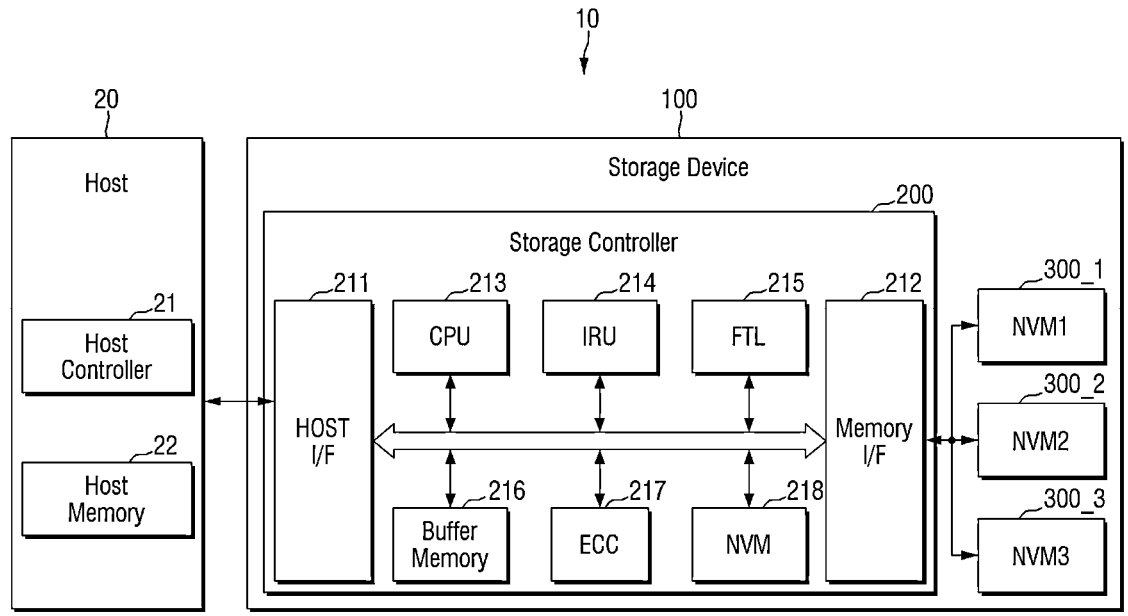
FIG. 1 is a block diagram illustrating a storage system according to some example embodiments.

FIG. 1 is a block diagram illustrating a storage system according to some example embodiments.

A storage system 10 may include a host 20 and a storage device 100. In addition, the storage device 100 may include a storage controller 200 and a plurality of non-volatile memory (NVM) devices 300-1 to 300-3. In addition, according to an example embodiment, the host 20 may include a host controller 21 and a host memory 22. The host memory 22 may function as a buffer memory for temporarily storing data to be transmitted to the storage device 100 or data transmitted from the storage device 100.

The storage device 100 may include storage media for storing data according to a request from the host 20. As an example, the storage device 100 may include at least one of a solid state drive (SSD), an embedded memory, and a removable external memory. When the non-volatile memory devices 300-1 to 300-3 are SSDs, the storage device 100 may be a device conforming to a non-volatile memory express (NVMe) standard. When the non-volatile memory devices 300-1 to 300-3 are embedded memories or external memories, the storage device 100 may be a device conforming to a universal flash storage (UFS) or embedded multimedia card (eMMC) standard. Each of the host 20 and the storage device 100 may generate and transmit packets according to an adopted standard protocol.

When the non-volatile memory devices 300-1 to 300-3 include a flash memory, the flash memory may include a 2D NAND memory array or a 3D (or vertical or bonding vertical) NAND (VNAND) memory array. As another example, the storage device 100 may include various other types of non-volatile memories. For example, the storage device 100 may include a magnetic random access memory (MRAM), a Spin-Transfer Torgue MRAM, a conductive bridging RAM (CBRAM), a ferroelectric RAM (FeRAM), a phase RAM (PRAM), a resistive RAM, and various other types of memories.

According to an example embodiment, the host controller 21 and the host memory 22 may be implemented as separate semiconductor chips. Alternatively, in some example embodiments, the host controller 21 and the host memory 22 may be integrated in the same semiconductor chip. As an example, the host controller 21 may be any one of a plurality of modules included in an application processor, and the application processor may be implemented as a system on chip (SoC). In addition, the host memory 22 may be an embedded memory provided in the application processor or be a non-volatile memory or a memory module disposed outside the application processor.

The host controller 21 may manage an operation of storing data (for example, write data) of the host memory 22 in the non-volatile memory devices 300-1 to 300-3 or storing data (for example, read data) of the non-volatile memory devices 300 into the host memory 22.

The storage controller 200 may include a host interface 211, a memory interface 212, and a central processing unit (CPU) 213. In addition, the storage controller 200 may further include an index read unit (IRU) 214, a flash translation layer (FTL) 215, a buffer memory 216, an error correction code (ECC) engine 217, and an internal non-volatile memory 218. The storage controller 200 may further include a working memory (not illustrated) to which the flash conversion layer (FTL) 214 is loaded, and data write and read operations for the non-volatile memory may be controlled by the CPU 213 executing the flash conversion layer.

The host interface 211 may transmit and receive packets to and from the host 20. The packet transmitted from the host 20 to the host interface 211 may include a command, data to be written to the non-volatile memory devices 300, or the like, and the packet transmitted from the host interface 211 to the host 20 may include a response to the command, data read from the non-volatile memory devices 300-1 to 300-3, or the like. The memory interface 212 may transmit data to be written to the non-volatile memory devices 300-1 to 300-3 to the non-volatile memory devices 300-1 to 300-3 or may receive data read from the non-volatile memory devices 300-1 to 300-3. Such a memory interface 212 may be implemented to comply with a standard convention such as toggle or open NAND flash interface (ONFI).

The flash translation layer 214 may perform several functions such as address mapping, wear-leveling, and garbage collection. In addition, the buffer memory 216 may temporarily store data to be written to the non-volatile memory devices 300 or data to be read from the non-volatile memory devices 300-1 to 300-3. The buffer memory 216 may be provided in the storage controller 200 but may also be disposed outside the storage controller 200.

The ECC engine 217 may perform an error detection and correction function for read data read from the non-volatile memory devices 300-1 to 300-3. More specifically, the ECC engine 217 may generate parity bits for write data to be written into the non-volatile memory devices 300-1 to 300-3, and the parity bits generated as described above may be stored in the non-volatile memory devices 300-1 to 300-3 together with the write data. At the time of reading data from the non-volatile memory devices 300-1 to 300-3, the ECC engine 217 may correct an error of read data using the parity bits read from the non-volatile memory devices 300-1 to 300-3 together with the read data, and output the read data of which the error is corrected. The internal non-volatile memory 218 may store a plurality of defense code parameter sets for each of the plurality of non-volatile memory devices 300-1 to 300-3. The defense code parameter set according to some example embodiments may be any one information set of a read-retry table, a read-retry table for each word line, a read level offset table for each temperature, patrol read information, erase/program operation voltage information that varies for each endurance cycle, and a read refresh table. Specifically, as an example embodiment, the plurality of defense code parameter sets may be a read level offset table predefined for each word line of memory cell arrays included in the non-volatile memory device 300. As an example embodiment, the plurality of defense code parameter sets may be a read level offset table predefined for each of a plurality of word line regions of a memory cell array included in any one non-volatile memory device 300. As an example embodiment, the plurality of defense code parameter sets may be a read level offset table predefined for each temperature of the memory cell array included in the non-volatile memory device 300.

Each defense code parameter set stored in the non-volatile memory 218 may be divided into a plurality of grades, such that health index information and a defense code parameter set for each grade may correspond to each other.

Figure 2:
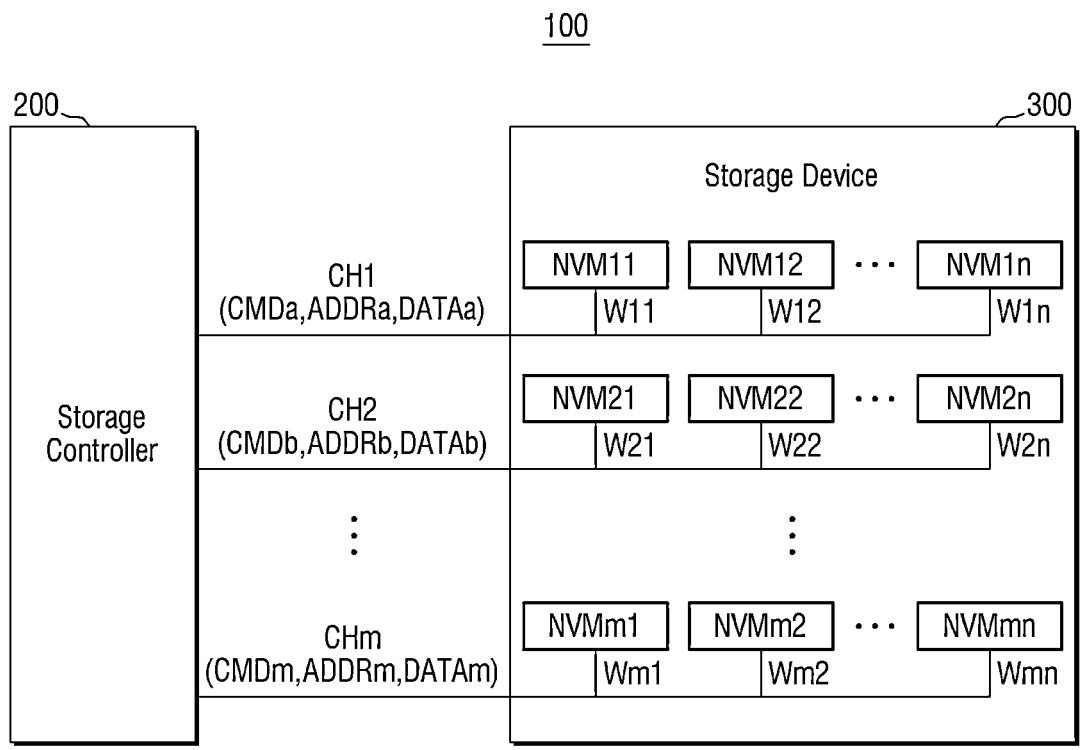
FIG. 2 is a block diagram illustrating a storage device according to some example embodiments.

FIG. 2 is a block diagram illustrating a storage device according to some example embodiments. Referring to FIG. 2, the non-volatile memory device 300 and the storage controller 200 may be connected to each other through a plurality of channels CH1 to CHm. For example, the storage device 100 may be implemented as a storage device such as a solid state drive (SSD).

The non-volatile memory device 300 may include a plurality of non-volatile memory devices NVM11 to NVMmn Each of the non-volatile memory devices NVM11 to NVMmn may be connected to one of the plurality of channels CH1 to CHm through a corresponding way. In an example embodiment, each of the non-volatile memory devices NVM11 to NVMmn may be implemented in an arbitrary memory unit capable of operating according to an individual command from the storage controller 200. For example, each of the non-volatile memory devices NVM11 to NVMmn may be implemented as a chip or die, but the present disclosure is not limited thereto.

The storage controller 200 may transmit and receive signals to and from the non-volatile memory device 300 through the plurality of channels CH1 to CHm. For example, the storage controller 200 may transmit commands CMDa to CMDm, addresses ADDRa to ADDRm, and data DATAa to DATAm to the non-volatile memory device 300 or receive data DATAa to DATAm from the non-volatile memory device 300, through the channels CH1 to CHm.

The storage controller 200 may select one of the non-volatile memory devices NVM11 to NVMmn connected to a corresponding channel through each channel and transmit and receive signals to and from the selected non-volatile memory device.

The storage controller 200 may transmit and receive signals to and from the non-volatile memory device 300 in parallel through different channels. For example, the storage controller 200 may transmit the command CMDb to the non-volatile memory device NVM21 through a second channel CH2 while transmitting the command CMDa to the non-volatile memory device NVM11 through a first channel CH1. For example, the storage controller 200 may receive the data DATAb from the non-volatile memory device NVM21 through the second channel CH2 while receiving the data DATAa from the non-volatile memory device NVM11 through the first channel CH1.

It has been illustrated in FIG. 2 that the non-volatile memory device 300 communicates with the storage controller 200 through m channels and the non-volatile memory device 300 includes n non-volatile memory devices corresponding to each channel, but the number of channels and the number of non-volatile memory devices connected to one channel may be variously modified.

Figure 3:
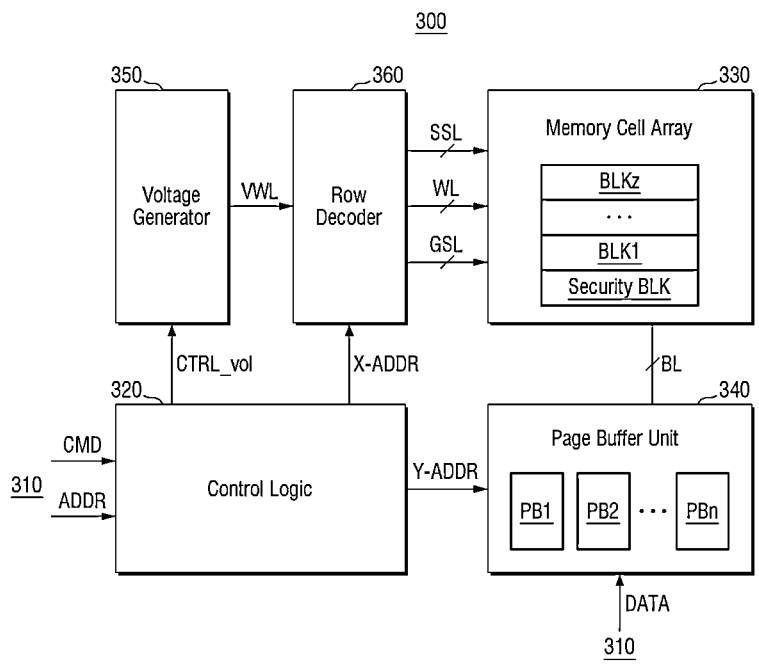
FIG. 3 is an example block diagram illustrating a non-volatile memory device.

FIG. 3 is an example block diagram illustrating a non-volatile memory device. Referring to FIG. 3, the non-volatile memory device 300 may include a control logic circuit 320, a memory cell array 330, a page buffer unit 340, a voltage generator 350, and a row decoder 360. The non-volatile memory device 300 may further include a memory interface circuit 310, and may further include a column logic, a pre-decoder, a temperature sensor, a command decoder, an address decoder, and the like.

The control logic circuit 320 may generally control various operations within the non-volatile memory device 300. The control logic circuit 320 may output various control signals in response to a command CMD and/or an address ADDR from the memory interface circuit 310. For example, the control logic circuit 320 may output a voltage control signal CTRL_vol, a row address X-ADDR, and a column address Y-ADDR.

The control logic circuit 320 may generally control various operations in the storage controller 200 and the non-volatile memory device 300 so as to perform an operation corresponding to a command of the host 20. For example, the control logic circuit 320 may transmit a normal read command to the non-volatile memory device 300 according to a host read command. When data corresponding to the normal read command is received from the non-volatile memory device 300, the control logic circuit 320 may transmit the data to the host 20. However, when the data corresponding to the normal read command is not properly read in the non-volatile memory device 300 (Read fail), the control logic circuit 320 may transmit a read-retry command to the non-volatile memory device 300. In this case, a case (Read fail) where the data corresponding to the normal read command is not properly read may be a case where an uncorrectable error is included in the read data. A read-retry operation may be restrictively performed within a predetermined number of times according to a setting or may be restrictively performed according to a type (e.g., hard decision or soft decision) of error correction operation. When the read-retry command continues to fail, the control logic circuit 320 may reselect a pre-defined table (hereinafter, referred to as a PDT) according to a health index and perform a read operation again.

The memory cell array 330 may include a plurality of memory blocks BLK1 to BLKz (z is a positive integer) and security blocks Security BLK, and each of the plurality of memory blocks BLK1 to BLKz and security blocks Security BLK may include a plurality of memory cells. The memory blocks BLK1 to BLKz may store user data transmitted from the storage controller 200.

The security block (Security BLK) may store security data such as status information of the non-volatile memory device 300. In an example embodiment, the security block Security BLK may store data related to health index information of the non-volatile memory device 300. According to some example embodiments, pre-stored health index information may include at least one of retention prediction index information, a cell reliability factor, chip position information, program time information (tPROG), read time information (tR), a process index, and wafer size information. Alternatively, according to some example embodiments, the health index information is information monitored in real time, and may include a cell count value extracted based on a reference voltage after a soft erase operation.

The memory cell array 330 may be connected to the page buffer unit 340 through bit lines BL and may be connected to the row decoder 360 through word lines WL, string selection lines SSL, and ground selection lines GSL.

In an example embodiment, the memory cell array 330 may include a three-dimensional (3D) memory cell array, and the 3D memory cell array may include a plurality of NAND strings. Each NAND string may include memory cells each connected to word lines vertically stacked on a substrate. U.S. Pat. Nos. 7,679,133, 8,553,466, 8,654,587, 8,559,235, and U.S. Patent Application Publication No. 2011/0233648 are herein incorporated by reference. In an example embodiment, the memory cell array 330 may include a two-dimensional (2D) memory cell array, and the 2D memory cell array may include a plurality of NAND strings arranged along row and column directions.

The page buffer unit 340 may include a plurality of page buffers PB1 to PBn (n is an integer of 3 or more), and the plurality of page buffers PB1 to PBn may be connected, respectively, to the memory cells through a plurality of bit lines BL. The page buffer unit 340 may select at least one of the bit lines BL in response to the column address Y-ADDR. The page buffer unit 340 may operate as a write driver or a sense amplifier according to an operation mode. For example, at the time of a program operation, the page buffer unit 340 may apply a bit line voltage corresponding to data to be programmed to the selected bit line. At the time of a read operation, the page buffer unit 340 may sense a current or voltage of the selected bit line to sense data stored in the memory cell.

The voltage generator 350 may generate various types of voltages for performing program, read, and erase operations based on the voltage control signal CTRL_vol. For example, the voltage generator 350 may generate a program voltage, a read voltage, a program verification voltage, an erase voltage, and the like, as word line voltages VWL.

The row decoder 360 may select one of a plurality of word lines WL and may select one of a plurality of string selection lines SSL, in response to the row address X-ADDR. The row decoder 360 may apply different operation voltages to the selected word line under the control of the control logic circuit 320.

For example, the row decoder 360 may apply the program voltage and the program verification voltage to the selected word line at the time of the program operation, and may apply a first read voltage to the selected word line at the time of the read operation. In addition, the row decoder 360 may apply a second read voltage obtained by adjusting a read level offset from the first read voltage at the time of a read-retry operation.

For example, the row decoder 360 may apply a normal erase operation voltage at the time of a normal erase operation and apply a soft erase operation voltage at the time of a soft erase operation. According to some example embodiments, the soft erase operation voltage has a lower voltage level than the normal erase operation voltage.

Figure 4:
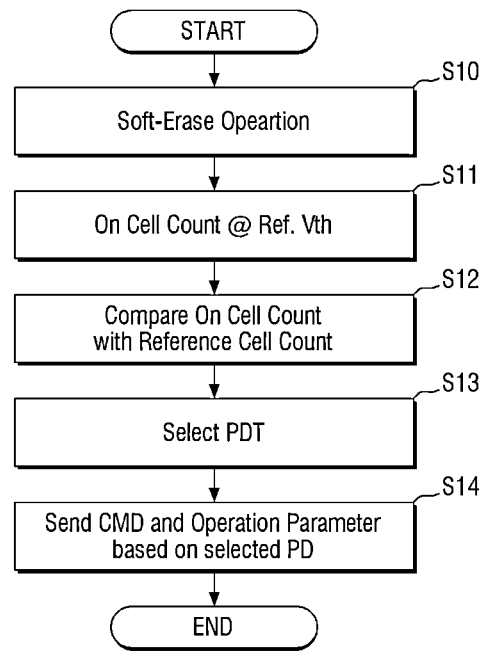
FIG. 4 is a flowchart illustrating an operation method of the storage device according to some example embodiments.
Figure 5:
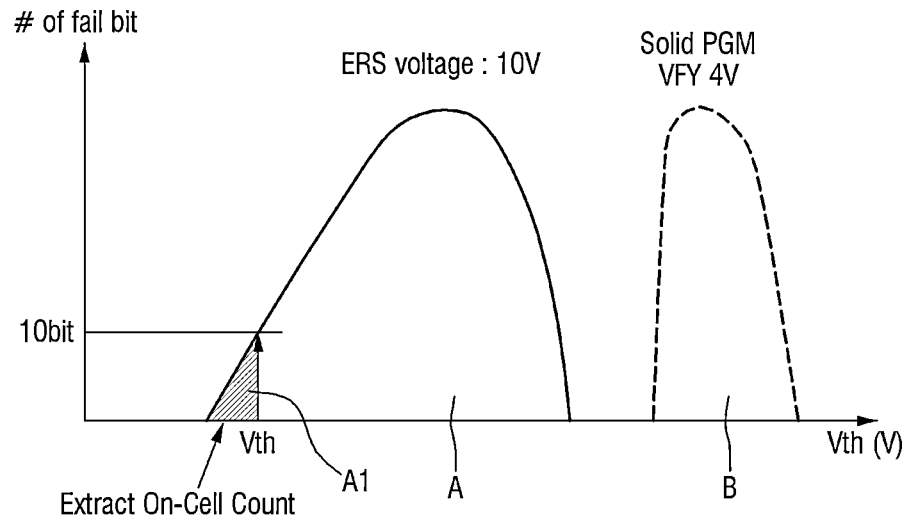
FIGS. 5 and 6 are voltage-fail bit graphs for describing a soft erase operation.
Figure 6:
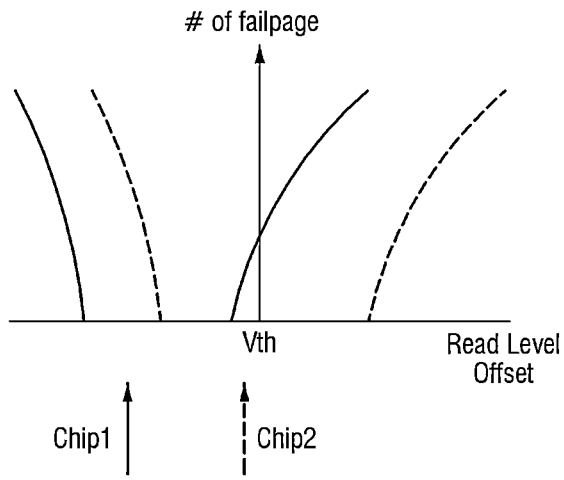
Figure 7:
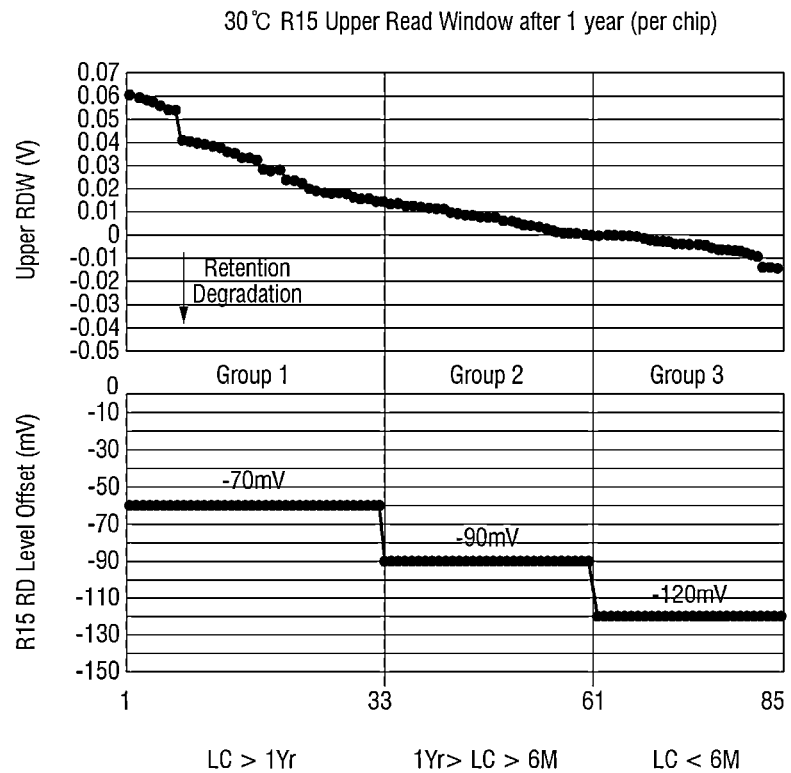
FIG. 7 is graphs for describing a read voltage level according to a retention degree of the storage device according to some example embodiments.

FIG. 4 is a flowchart illustrating an operation method of the storage device according to some example embodiments, and FIGS. 5 and 6 are voltage-fail bit graphs for describing a soft erase operation. FIG. 7 is graphs for describing a read voltage level according to a retention degree of the storage device according to some example embodiments.

Referring to FIG. 4, the non-volatile memory device 300 performs a soft erase operation (S10). The soft erase operation is an operation of erasing some data with an erase operation voltage lower than that of a normal erase operation of erasing data stored in a memory cell. For example, when a normal erase operation voltage is 10 V, a soft erase operation voltage may be 8 V.

As an example, referring to FIG. 5, it is assumed that a cell distribution in an erase state is A and a cell distribution in a first program state is B. When the normal erase operation is performed, the normal erase operation may be performed on the cell distribution of the entire region A, while when the soft erase operation is performed, the soft erase operation may be performed only on a region excluding region A1.

According to some example embodiments, the non-volatile memory device 300 extracts an on-cell count value from the memory cell based on a reference voltage after performing the soft erase operation. In an example illustrated in FIG. 5, the non-volatile memory device 300 extracts an on-cell count value of region A1. Alternatively, according to some other example embodiments, the non-volatile memory device 300 may indirectly get an on-cell count value by extracting an off-cell count value from the memory cell based on a reference voltage after performing the soft erase operation.

However, when the non-volatile memory device 300 includes a plurality of non-volatile memory devices, a cell distribution may be different for each chip or die on which each non-volatile memory device is disposed. For example, as illustrated in FIG. 6, a cell distribution of a first chip Chip1 may have a different read level from that of a cell distribution of a second chip Chip2 according to characteristics of chips. With respect to a reference value Vth of a read level offset, a left cell distribution curve and a right cell distribution curve of the second chip Chip2 are spaced apart from the reference value Vth by similar intervals, but both of a left cell distribution curve and a right cell distribution curve of the first chip Chip1 are positioned on the left of the reference value Vth. Accordingly, when the second chip Chip2 is read with the reference value Vth, a fail does not occur, but when the first chip Chip1 is read with the reference value Vth, a read fail may occur for a page of a right cell distribution. The reason is that data retention characteristics may vary for each chip due to an influence of a deformed channel hole because a channel hole penetrating through the chip is not implemented in a perfectly circular shape in a process.

Referring to FIG. 7, which illustrates retention characteristics per chip of a non-volatile memory device operating at 30° C., an X direction indicates a lifespan of the chip, a Y direction of an upper graph indicates a voltage of an upper read window after one year, and a Y-direction of a lower graph indicates a read level offset. It is assumed that lifespans 1 to 33 of the chip are Group 1, lifespans 33 to 61 of the chip are Group 2, and lifespans 61 to 85 of the chip are Group 3, according to the read level offset.

It can be seen from the upper graph that as the lifespan of the chip increases (that is, goes from 1 to 85), a read window interval after the chip operates under the same condition for the same period (1 year) gradually decreases from 0.06 to −0.01 or less, such that data retention is degraded. When the read window interval decreases, a cell distribution changes like the first chip Chip1, and thus, a fail page occurs with respect to the reference value of the read level offset as in FIG. 6 described above.

In order to eliminate the fail page, the storage controller 200 may divide the lifespan of the chip into a plurality of groups and vary a read window for each group by a read level offset selected according to the lifespan of the chip, as illustrated in the lower graph. The storage controller 200 may include a pre-defined table (hereinafter, referred to as PDT) storing read level offset values that vary according to a state of the non-volatile memory device, according to some example embodiments.

FIGS. 8 to 11 are flowcharts illustrating operation methods of a storage device according to some other example embodiments. FIG. 12 is a graph for describing soft decision decoding according to some example embodiments.

The storage device 100 may extract health index information according to a soft erase operation according to various example embodiments.

Figure 8:
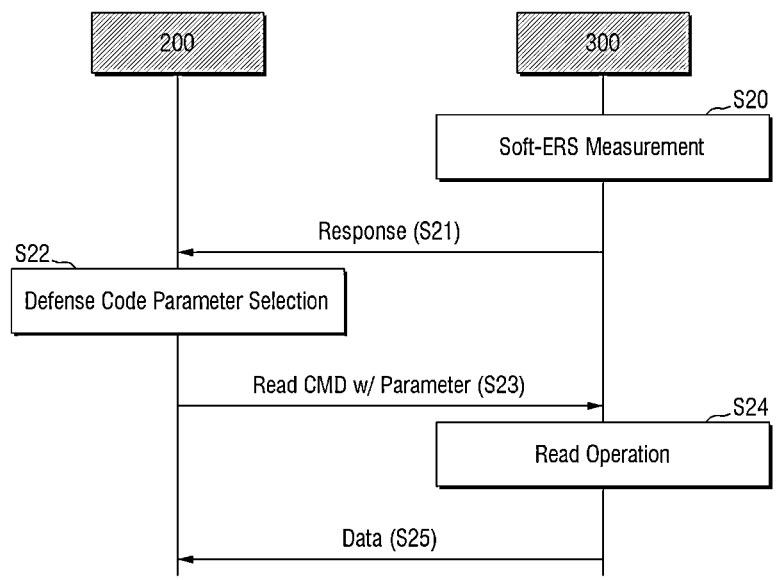
FIGS. 8 to 11 are flowcharts illustrating operation methods of a storage device according to some other example embodiments.

Referring to FIG. 8, according to some example embodiments, the non-volatile memory device 300 first performs a soft erase operation (S20), and then extracts health index information of the non-volatile memory device in real time and transmits the health index information to the storage controller 200 (S21). As an example, the health index information may include an on-cell count based on a cell distribution of a soft erase operation. Alternatively, as another example, the health index information may include an off-cell count based on a cell distribution of a soft erase operation. The soft erase operation may be performed based on a soft erase command of the storage controller 200 according to an example embodiment or may be periodically performed by the non-volatile memory device 300 according to another example embodiment.

The storage controller 200 selects any one of a plurality of defense code parameter sets based on the health index information (S22).

According to some example embodiments, the defense code parameter set includes a read level offset table pre-defined for each word line of the memory cell array. The read level offset table may include a read level offset corresponding to the health index information. According to various example embodiments, the read level offset table may have different read level offset sets for each non-volatile memory device, for each chip, for each word line region, for each temperature region, or for each word line.

For example, a read level offset table of a first non-volatile memory device (e.g., 300-1) disposed on the first chip may include a read level offset set different from a read level offset table of a second non-volatile memory device (e.g., 300-2) disposed on the second chip. For example, also in one non-volatile memory device, a read level offset table for a first word line region may be different from a read level offset table for a second word line region. For example, also in one non-volatile memory device, a read level offset table for a first temperature region may be different from a read level offset table for a second temperature region. Alternatively, for example, also in one non-volatile memory device, a read level offset table for a first word line may be different from a read level offset table for a second word line.

Alternatively, according to some example embodiments, the defense code parameter set may be any one of a read-retry table, a read-retry table for each word line, a read level offset table for each temperature, patrol read information, erase/program operation voltage information that varies for each endurance cycle, and a read refresh table.

The storage controller 200 transmits a normal read command to the non-volatile memory device (S23). The normal read command may include a defense code parameter set selected to correspond to each health index information. The non-volatile memory device 300 may select a read level offset based on the defense code parameter set included in the received normal read command. The non-volatile memory device 300 performs a read operation by applying the selected read level offset to a read level (S24). The non-volatile memory device 300 transmits data corresponding to the normal read command to the storage controller (S25).

Figure 9:
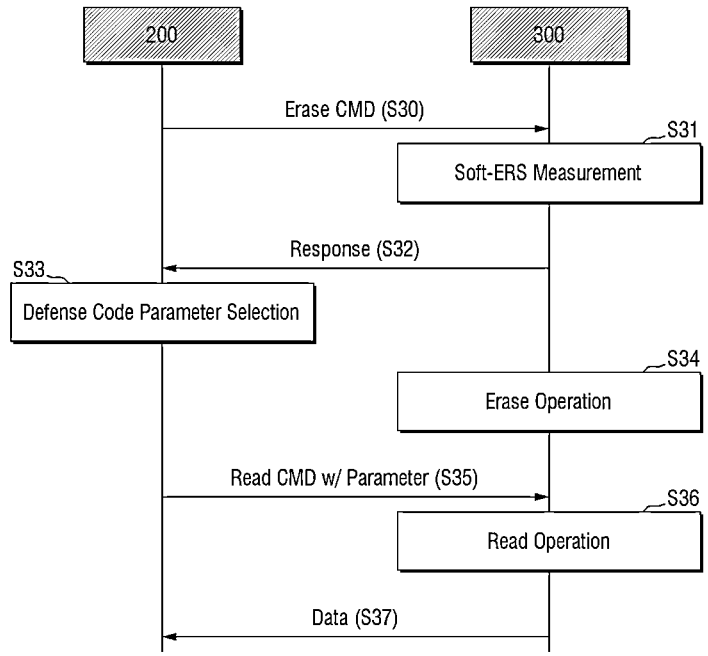

Referring to FIG. 9, according to some example embodiments, the storage controller 200 transmits a normal erase command (S30). The non-volatile memory device 300 first performs a soft erase operation before performing a normal erase operation (S31). According to the soft erase operation, the non-volatile memory device 300 extracts health index information of the non-volatile memory device in real time and transmits the health index information to the storage controller 200 (S32). For example, the health index information may include an on-cell count (or an off-cell count) based on a memory cell distribution according to the soft erase operation.

The storage controller 200 selects any one of a plurality of defense code parameter sets based on the health index information of the non-volatile memory device 300 (S33). Thereafter, the non-volatile memory device 300 performs the normal erase operation (S34).

Although not illustrated, when the storage controller 200 receives a read command from the host 20, the storage controller 200 transmits a normal read command including the defense code parameter set selected in S33 to the non-volatile memory device 300 (S35). The non-volatile memory device 300 performs a read operation by applying a read level offset selected based on the selected code parameter set to a read level (S36). The non-volatile memory device 300 transmits data corresponding to the normal read command to the storage controller (S37).

Figure 10:
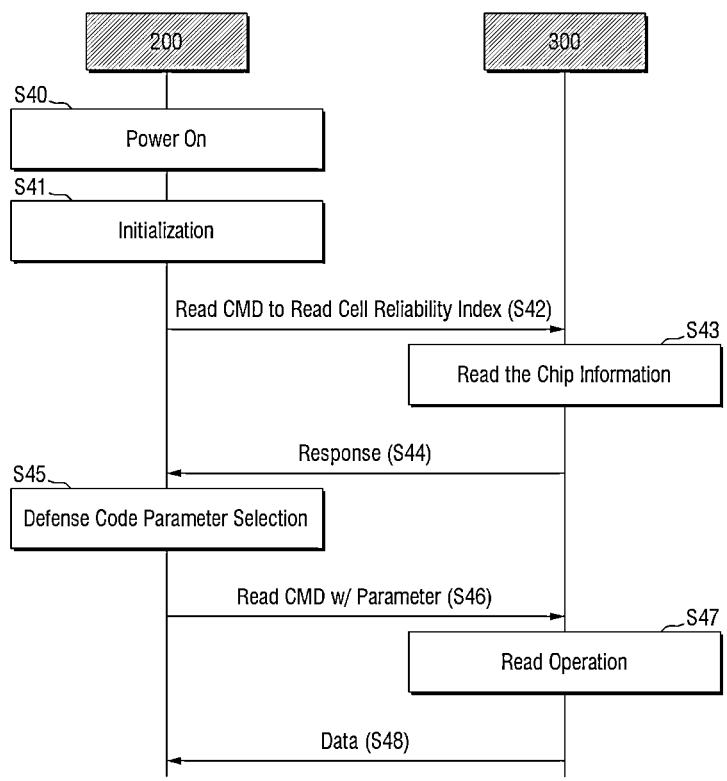

Referring to FIG. 10, according to some example embodiments, when the storage device 100 is powered on (S40), the storage controller 200 transmits a secure read command to read cell reliability index information (Secure Read CMD) (S42) while performing initialization (S41). For example, the secure read command may be a command to read health index information stored in the security block of the memory cell array described with reference to FIG. 3. According to some example embodiments, the health index information stored in the security block may include at least one of retention prediction index information, a cell reliability factor, chip position information, program time information (tPROG), read time information (tR), a process index, and wafer size information.

The non-volatile memory device 300 may read chip information (e.g., pre-stored health index information) according to the secure read command (S43) and transmit the chip information to the storage controller 200 (S44). Thereafter, S45 to S48 overlap S22 to S25 of FIG. 8 described above.

Figure 11:
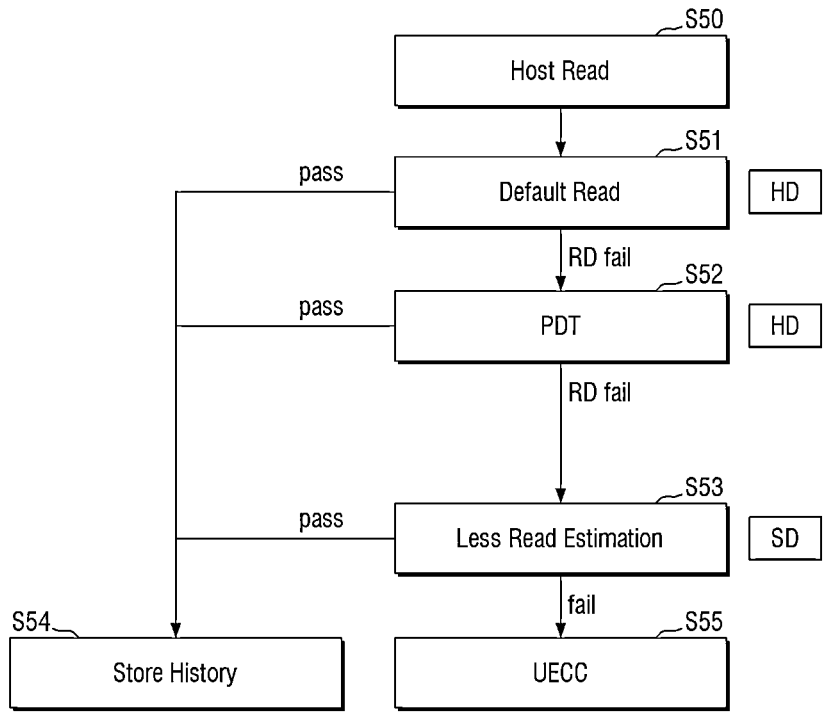
Figure 12:
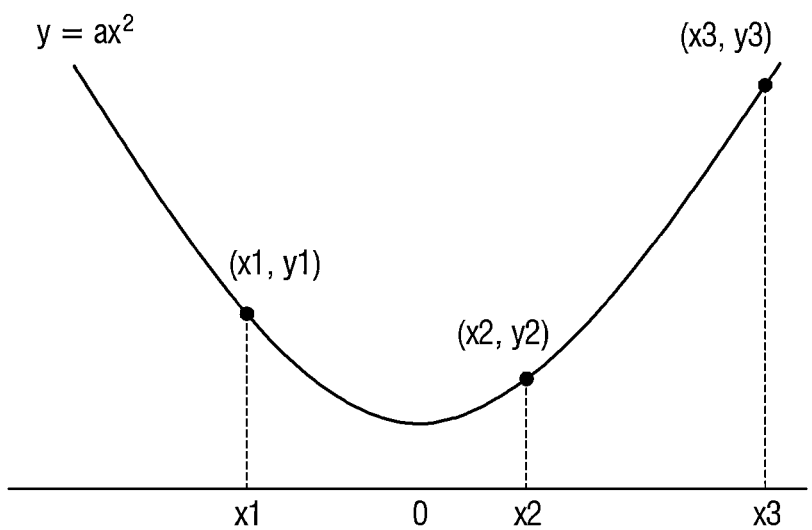
FIG. 12 is a graph for describing soft decision decoding according to some example embodiments.

Referring to FIG. 11, the storage controller 200 receives a host read command (S50). Thereafter, the storage controller 200 may transmit a normal read command to the non-volatile memory device 300 (SM), confirm data read from the non-volatile memory device 300, and store environment information (e.g., a read voltage level) as a history in the buffer memory of the non-volatile memory 218 (S54) if the read operation passes.

If a first normal read operation fails (SM: fail), the storage controller 200 selects a defense code parameter set (e.g., a pre-defined table (PDT) parameter) according to an example embodiment of any one of FIGS. 8 to 10, and then transmits a read command to the non-volatile memory device 300 again. According to some example embodiments, whether or not the data read operation passes in SM and S52 may be verified by hard decision decoding (HD).

In this case, if the read operation passes, the environment information is stored in S54, as described above, and if the read operation fails, soft decision decoding is performed (S53). The soft decision decoding is to find a read voltage by applying a predetermined offset to a hard decision read voltage of selected data.

The soft decision decoding is less read estimation, that is, a decoding method of estimating a read level of an inflection point by measuring cell counts at a predetermined number of voltage points near the hard decision read voltage and approximating the measured cell counts to a quadratic function or a cubic function passing through the cell count of each point. For example, referring to FIG. 12, assuming that the cell count is a quadratic function, a read level (point where x=0) of a cell count corresponding to an inflection point may be found by measuring cell counts when the read level is x1, when the read level is x2, and when the read level is x3, respectively.

The hard decision decoding is efficient because it uses a small amount of resources, but may have relatively low error correction capability. On the other hand, the soft decision decoding has a higher error correction capability than the hard decision decoding, but uses a large amount of resources. Accordingly, the hard decision decoding is first performed in S51 and S52, and when the hard decision decoding fails, the soft decision decoding is performed in S53. If the read operation passes when the soft decision decoding has been performed, corresponding environment information is stored as a history in the buffer memory (S54). However, if the data read operation fails even with the soft decision decoding, the data is determined as uncorrectable data (UECC) and the read operation is stopped (S55).

FIGS. 13 and 14 are tables illustrating a pre-defined parameter table (PDT) according to some example embodiments. The storage controller 200 may include a pre-defined table (hereinafter, referred to as PDT) storing read level offset values that vary according to a state of the non-volatile memory device, according to some example embodiments.

According to an example embodiment, the PDT may divide the non-volatile memory devices 300 into a plurality of groups according to states of the non-volatile memory devices 300 and differently apply a read level offset according to a state (e.g., a lifespan according to a cell distribution) to each group.

For example, the PDT illustrated in FIG. 13 is a table in which the non-volatile memory devices 300 are divided into a plurality of groups according to the states of the non-volatile memory devices 300 and read level offsets mapped to the respective groups are defined. The non-volatile memory devices 300 are divided into Group 1, Group 2, and Group 3 according to read level offsets of States R1, R2, . . . , R15 of the non-volatile memory devices.

For example, read level offsets of States R1 to R9 of Group 1 may be the same as read level offsets of States R1 to R9 of Group 2, but read level offsets of States R10 to R15 of Group 1 and Group 2 may be different from each other.

For example, in State R15, a read level offset of Group 1 may be −70 mV, but a read level offset of Group 2 may be −90 mV. That is, the storage controller 200 may confirm a group to which a lifespan of a chip on which each non-volatile memory device 300 is disposed belongs, and apply a read level offset of the group to which the chip belongs.

According to another example embodiment, the PDT may divide each of the non-volatile memory devices 300 into a plurality of groups according to states, divide each of the groups into a plurality of regions for each word line within the same chip, and define read level offsets.

Referring to FIG. 14, the PDT illustrated in FIG. 14 may not only divide each of the non-volatile memory devices 300 into groups Group 1, Group 2, and Group 3 for each state, but may also divide the groups for each of selected Word lines WL3 to 16, WL17 to 40, WL41 to 90 within one chip, and may differently apply a read level offset to each word line. For example, in a non-volatile memory device belonging to Group 1, a read level offset of Word Line WL5 of State R15 may be −70 mV, but a read level offset of Word Line WL45 of State R15 may be −80 mV. That is, the storage controller 200 may confirm a group and a region to which the state of the non-volatile memory device 300 and the selected word line belong, respectively, and apply a read level offset that varies for each non-volatile memory device and each word line.

Alternatively, although not illustrated, according to another example embodiment, the PDT may include a plurality of groups divided for each temperature region according to an operation of the non-volatile memory device. For example, a read level offset of Word Line WL30 belonging to a high temperature region may be different from a read level offset of Word Line WL30 belonging to a low temperature region.

According to another example embodiment, the PDT may include a read level offset set divided into a different number of groups according to the non-volatile memory device or a chip on which the non-volatile memory device is disposed. For example, a PDT of the first non-volatile memory device may be defined as a read level offset set of n groups divided into n regions, and a PDT of the second non-volatile memory device may be defined as a read level offset set of m groups divided into m regions. Here, n and m are natural numbers, and may be different numbers.

Figure 15:
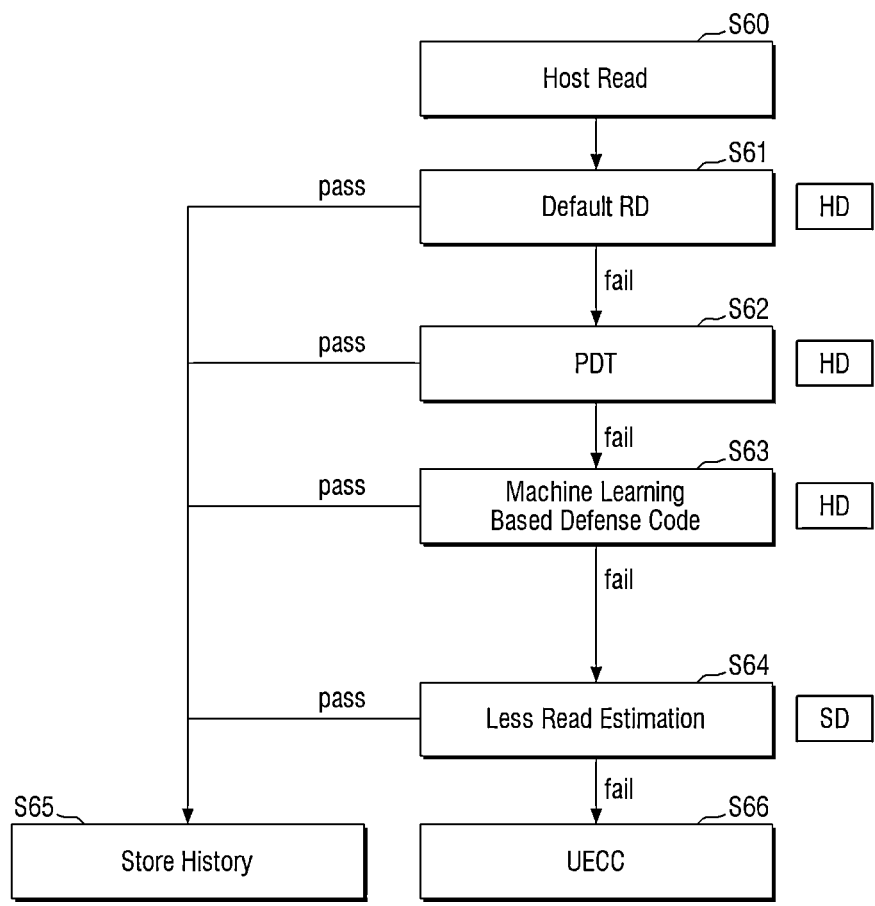
FIGS. 15 and 16 are flowcharts illustrating operation methods of the storage device according to some example embodiments.
Figure 16:
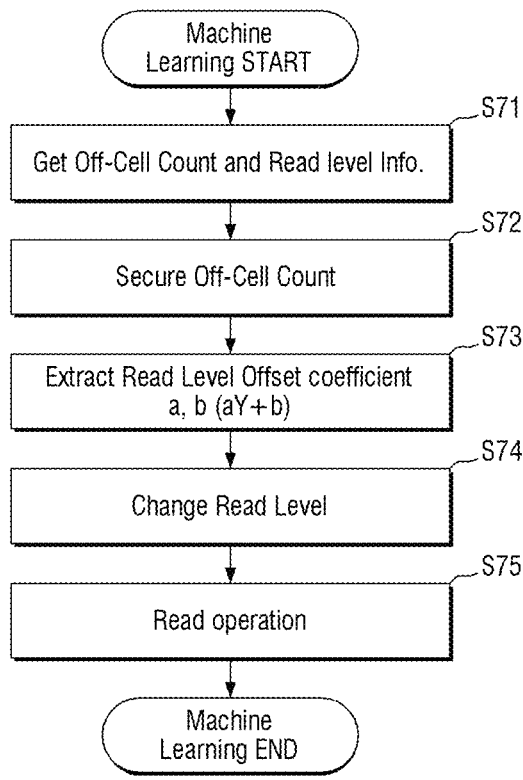
Figure 17A:
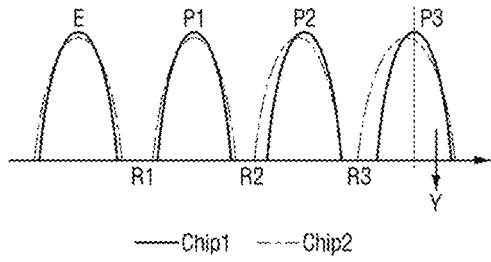
FIGS. 17A and 17B are graphs for describing machine learning of a read level distribution for each chip of FIG. 16.
Figure 17B:
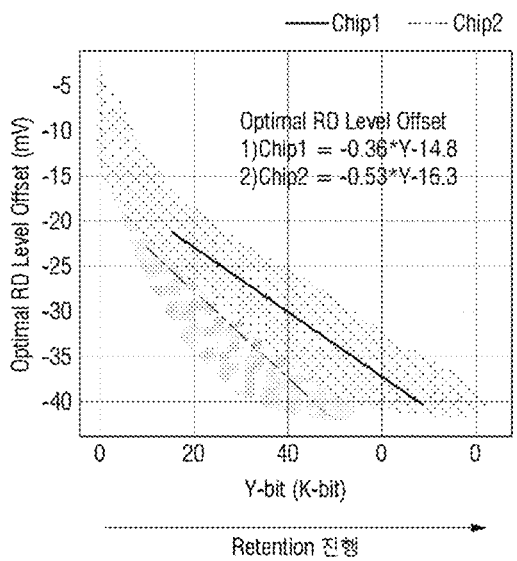

FIGS. 15 and 16 are flowcharts illustrating operation methods of the storage device according to some example embodiments, and FIGS. 17A and 17B are graphs for describing machine learning of a read level distribution for each chip of FIG. 16.

Referring to FIGS. 15 and 16, the storage device may find an optimal or improved read level offset through machine learning. As an example, the storage controller 200 receives a host read command (S60). The storage controller 200 may transmit a normal read command to the non-volatile memory device 300 according to a request of the host in S60, confirm data read from the non-volatile memory device 300, and store environmental information (e.g., status information (chip position, word line, temperature, etc.), a read level, a read level offset, etc., of the non-volatile memory device) as a history in the non-volatile memory 218 (S65) if a read operation passes (S61: pass).

If a first normal read operation fails (S61: fail), the storage controller 200 selects a defense code parameter set (e.g., a PDT parameter) according to an example embodiment of any one of FIGS. 8 to 10, and then transmits a read-retry command including the selected defense code selected parameter set to the non-volatile memory device 300 again (S62). According to some example embodiments, whether or not the data read operation passes in S61 and S62 may be verified by hard decision decoding (HD).

In this case, if the read operation passes (S62: pass), the storage controller 200 stores environment information that is a basis of the passage of the read operation in the buffer memory, as described above (S65), and if the read operation fails (S62: fail), the storage controller 200 performs machine learning on an optimal or improved read level offset corresponding to a chip state based on the information stored in the previous processes (for example, the environment information stored in S65) (S63).

Describing machine learning in detail with reference to FIGS. 16 and 17, the storage device gets a read level position while extracting an off-cell count value through a soft erase operation (S71). The soft erase operation may be performed based on a preset command (e.g., a soft erase command or a power-on initialization or normal erase command) according to some example embodiments.

When the storage device 100 performs the soft erase operation two times or more on the non-volatile memory device 300 disposed on each chip, such that an off-cell count value is extracted for each order (S72), the storage device 100 extracts a read level offset from the off-cell count value of each order. For example, a read level (for example, a vertical dotted line of P3) is determined according to an off-cell distribution for each first chip and second chip, as illustrated in FIG. 17A, and a trend line between the off-cell count value and the read level is got by machine learning, as illustrated in FIG. 17B, for the determined read level. That is, assuming that the trend line is a linear function (y=ax+b) having linearity, a coefficient (a) and an intercept (b) of the trend line are extracted by machine learning (S73). In an example illustrated in FIG. 17B, (coefficient, intercept) (a, b) may be extracted as (−0.36, −14.8) from an off-cell count value distribution of Chip 1, and (coefficient, intercept) (a, b) may be extracted as (−0.53, −16.3) from an off-cell count value distribution of Chip 2.

The storage controller 200 may extract an optimal or improved read level offset based on the learned trend line (S73), and apply the extracted optimal or improved read level offset to adjust the read level again (S74). The storage controller 200 performs the read operation again at the adjusted read level (S75). The storage controller 200 may perform the read operation at the read level adjusted by the machine learning in S63, confirm the read data, performs S65 if the read operation passes (S63: pass), and adjust the read voltage with less read estimation, that is, soft decision decoding and then read the data if the read operation fails (S63: fail). If the data read operation passes with the soft decision decoding (S64: pass), the corresponding environment information is stored in the buffer memory (S65). However, if the data read operation fails even with the soft decision decoding (S64: fail), the data is determined as uncorrectable data (UECC) and the read operation is stopped (S66).

Figure 18:
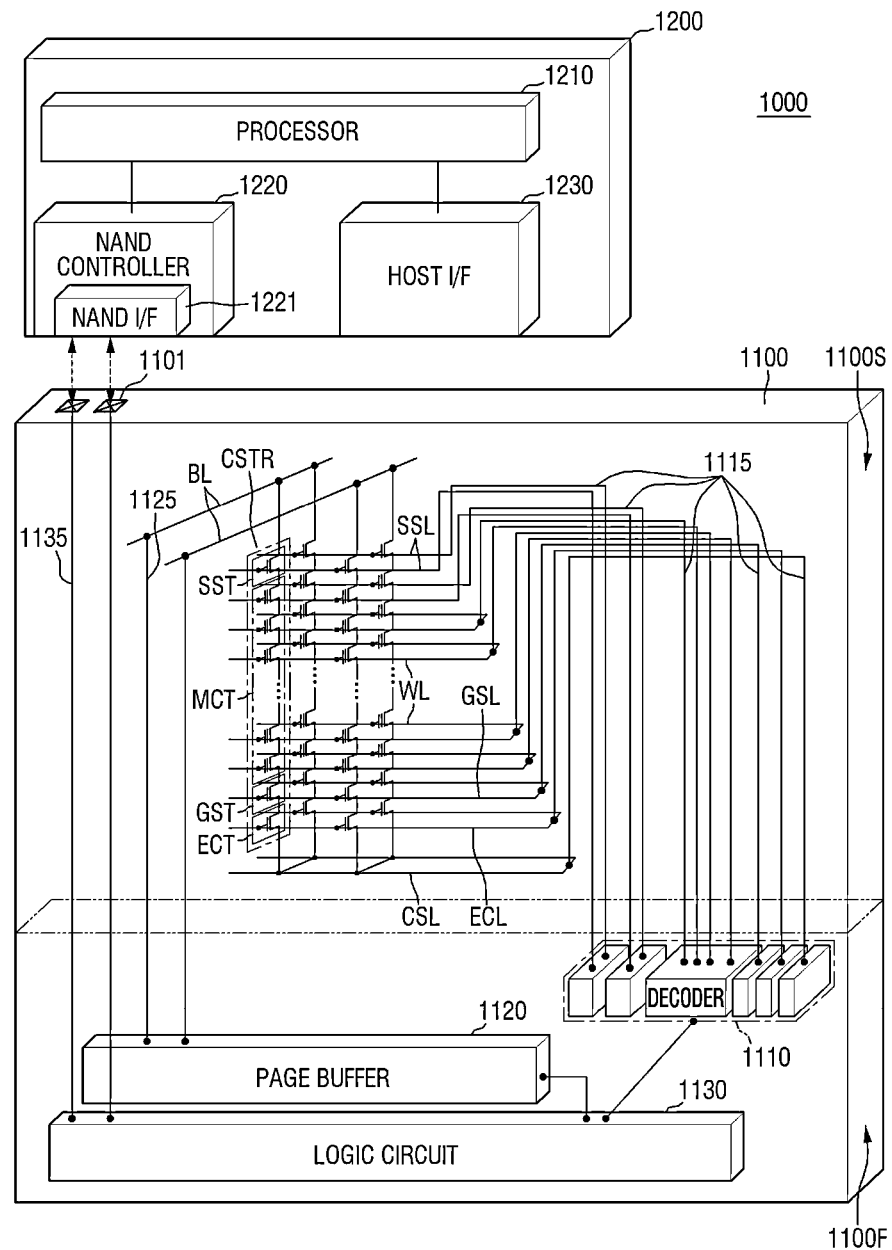
FIG. 18 is a schematic block diagram illustrating an electronic system including a semiconductor memory device according to some example embodiments.
Figure 19:
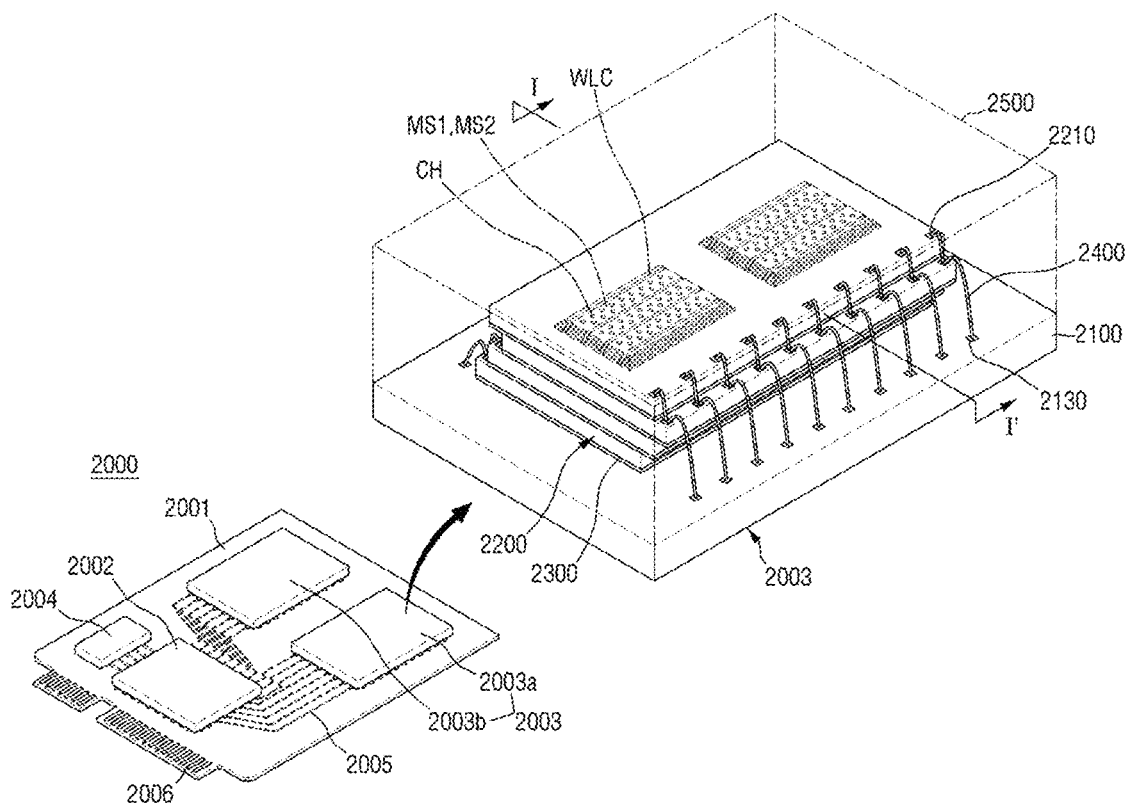
FIG. 19 is a schematic perspective view illustrating an electronic system including a semiconductor memory device according to some example embodiments.

FIG. 18 is a schematic block diagram illustrating an electronic system including a semiconductor memory device according to some example embodiments. FIG. 19 is a schematic perspective view illustrating an electronic system including a semiconductor memory device according to some example embodiments.

Referring to FIG. 18, an electronic system 1000 according to some example embodiments may include a semiconductor memory device 1100 and a controller 1200 electrically connected to the semiconductor memory device 1100. The electronic system 1000 may be a storage device including one semiconductor memory device 1100 or a plurality of semiconductor memory devices 1100 or an electronic device including the storage device. For example, the electronic system 1000 may be a solid state drive (SSD) device, a universal serial bus (USB), a computing system, a medical device, or a communication device including one semiconductor memory device 1100 or a plurality of semiconductor memory devices 1100.

The semiconductor memory device 1100 may be a non-volatile memory device (e.g., a NAND flash memory device), and may be, for example, the semiconductor memory device described above with reference to FIGS. 1 to 17B. The semiconductor memory device 1100 may include a first structure 1100F and a second structure 1100S on the first structure 1100F.

The first structure 1100F may be a peripheral circuit structure including a decoder circuit 1110 (e.g., the row decoder 360 of FIG. 3), a page buffer 1120 (e.g., the page buffer unit 340 of FIG. 3), and a logic circuit 1130 (e.g., the control logic circuit 320 of FIG. 3).

The second structure 1100S may include the common source line CSL, the plurality of bit lines BL, and the plurality of cell strings CSTR. The cell strings CSTR may be connected to the decoder circuit 1110 through a word line WL, at least one string select line SSL, and at least one ground select line GSL. In addition, the cell strings CSTR may be connected to the page buffer 1120 through the bit lines BL.

In some example embodiments, the common source line CSL and the cell strings CSTR may be electrically connected to the decoder circuit 1110 through first connection wirings 1115 extending from the first structure 1100F to the second structure 1100S. The first connection wirings 1115 may correspond to first through contacts. The first through contacts may electrically connect respective gate electrodes ECL, GSL, WL, and SSL and the decoder circuit 1110 (e.g., the row decoder 360 of FIG. 3) to each other.

In some example embodiments, the bit lines BL may be electrically connected to the page buffer 1120 through second connection wirings 1125 extending from the first structure 1100F to the second structure 1100S. The second connection wirings 1125 may correspond to first through contacts 166. That is, the first through contacts 166 may electrically connect the bit lines BL and the page buffer 1120 (e.g., the page buffer unit 340 of FIG. 3) to each other.

The semiconductor memory device 1100 may communicate with the controller 1200 through input/output pads 1101 electrically connected to the logic circuit 1130 (e.g., the control logic circuit 320 of FIG. 3). The input/output pads 1101 may be electrically connected to the logic circuit 1130 through input/output connection wirings 1135 extending from the first structure 1100F to the second structure 1100S.

The controller 1200 may include a processor 1210, a NAND controller 1220, and a host interface 1230. In some example embodiments, the electronic system 1000 may include a plurality of semiconductor memory devices 1100, and in this case, the controller 1200 may control the plurality of semiconductor memory devices 1100.

The processor 1210 may control a general operation of the electronic system 1000 including the controller 1200. The processor 1210 may operate according to predetermined firmware, and may access the semiconductor memory device 1100 by controlling the NAND controller 1220. The NAND controller 1220 may include a NAND interface 1221 processing communication with the semiconductor memory device 1100. A control command for controlling the semiconductor memory device 1100, data to be written to memory cell transistors MCT of the semiconductor memory device 1100, data to be read from the memory cell transistors MCT of the semiconductor memory device 1100, and the like, may be transmitted through the NAND interface 1221. The host interface 1230 may provide a communication function between the electronic system 1000 and an external host. When a control command is received from the external host through the host interface 1230, the processor 1210 may control the semiconductor memory device 1100 in response to the control command.

Referring to FIG. 19, an electronic system according to some example embodiments may include a main board 2001 and a main controller 2002, one or more semiconductor packages 2003, and a dynamic random access memory (DRAM) 2004 that are mounted on the main board 2001. The semiconductor package 2003 and the DRAM 2004 may be connected to the main controller 2002 by wiring patterns 2005 formed on the main board 2001.

The main board 2001 may include a connector 2006 including a plurality of pins coupled to an external host. The number and an arrangement of the plurality of pins in the connector 2006 may vary depending on a communication interface between the electronic system 2000 and the external host. In some example embodiments, the electronic system 2000 may communicate with the external host according to any one of interfaces such as universal serial bus (USB), peripheral component interconnect express (PCI-Express), serial advanced technology attachment (SATA), and M-Phy for universal flash storage (UFS). In some example embodiments, the electronic system 2000 may operate by power supplied from the external host through the connector 2006. The electronic system 2000 may further include a power management integrated circuit (PMIC) distributing the power supplied from the external host to the main controller 2002 and the semiconductor package 2003.

The main controller 2002 may write data to or read data from the semiconductor package 2003 and may improve an operation speed of the electronic system 2000.

The DRAM 2004 may be a buffer memory for alleviating a speed difference between the semiconductor package 2003, which is a data storage space, and the external host. The DRAM 2004 included in the electronic system 2000 may operate as a kind of cache memory, and may provide a space for temporarily storing data in a control operation for the semiconductor package 2003. When the electronic system 2000 includes the DRAM 2004, the main controller 2002 may further include a DRAM controller for controlling the DRAM 2004, in addition to a NAND controller for controlling the semiconductor package 2003.

The semiconductor package 2003 may include a first semiconductor package 2003*a* and a second semiconductor package 2003*b* spaced apart from each other. Each of the first semiconductor package 2003*a* and the second semiconductor package 2003*b* may be a semiconductor package including a plurality of semiconductor chips 2200. Each of the first semiconductor package 2003*a* and the second semiconductor package 2003*b* may include a package substrate 2100, the semiconductor chips 2200 disposed on the package substrate 2100, adhesive layers 2300 disposed on lower surfaces of the semiconductor chips 2200, connection structures 2400 electrically connecting the semiconductor chips 2200 to the package substrate 2100, and a molding layer 2500 covering the semiconductor chips 2200 and the connection structures 2400 on the package substrate 2100.

The package substrate 2100 may be a printed circuit board including package upper pads 2130. Each semiconductor chip 2200 may include input/output pads 2210. The input/output pads 2210 may correspond to the input/output pads 1101 of FIG. 18.

In some example embodiments, the connection structures 2400 may be bonding wires electrically connecting the input/output pads 2210 to the package upper pads 2130. Accordingly, in each of the first semiconductor package 2003*a* and the second semiconductor package 2003*b*, the semiconductor chips 2200 may be electrically connected to each other in a bonding wire manner, and be electrically connected to the package upper pads 2130 of the package substrate 2100. In some example embodiments, in each of the first semiconductor package 2003*a* and the second semiconductor package 2003*b*, the semiconductor chips 2200 may be electrically connected to each other by connection structures including through silicon vias (TSVs) instead of bonding wire-type connection structures 2400.

In some example embodiments, the main controller 2002 and the semiconductor chips 2200 may be included in one package. In some example embodiments, the main controller 2002 and the semiconductor chips 2200 may be mounted on a separate interposer substrate different from the main board 2001, and the main controller 2002 and the semiconductor chips 2200 may be connected to each other by wirings formed on the interposer substrate.

In some example embodiments, the package substrate 2100 may be a printed circuit board. The package substrate 2100 may include a package substrate body part 2120, the package upper pads 2130 disposed on an upper surface of the package substrate body part 2120, lower pads 2125 disposed on or exposed through a lower surface of the package substrate body part 2120, and internal wirings 2135 electrically connecting the package upper pads 2210 and the lower pads 2200 to each other in the package substrate body part 2300. The package upper pads 2210 may be electrically connected to the connection structures 2400. The lower pads 2200 may be connected to the wiring patterns 2005 of the main board 2001 of the electronic system 2000 as illustrated in FIG. 19 through conductive connectors 2006.

Additionally, the host controller 21, the control logic and/or the components included therein may include processor(s) and/or processing circuitry such as hardware including logic circuits; a hardware/software combination such as a processor executing software; or a combination thereof. For example, the processor(s) and/or processing circuitry may include, but is not limited to, a central processing unit (CPU), a memory controller, an arithmetic logic unit (ALU), a digital signal processor, a microcomputer, a field programmable gate array (FPGA), and programmable logic unit, a microprocessor, application-specific integrated circuit (ASIC), etc.

Processor(s), controller(s), and/or processing circuitry may be configured to perform actions or steps by being specifically programmed to perform those action or steps (such as with an FPGA or ASIC) or may be configured to perform actions or steps by executing instructions received from a memory, or a combination thereof.

The example embodiments of the present disclosure have been described hereinabove with reference to the accompanying drawings, but it will be understood by one of ordinary skill in the art to which the present disclosure pertains that various modifications and alterations may be made without departing from the technical spirit or essential feature of the present disclosure. Therefore, it is to be understood that the example embodiments described above are illustrative rather than being restrictive in all example embodiments.

What is claimed is:

1. A storage device comprising:
a first non-volatile memory device;
a second non-volatile memory device;
a third non-volatile memory device; and
a storage controller including processing circuitry configured to
set first to third read level offsets of the respective first to third non-volatile memory devices by,
extracting a respective one of first through third on-cell count values by performing a respective one of first through third soft erase operations on the respective one of the first to third non-volatile memory devices, and
determining a respective one of the first to third read level offsets based on a distribution of the respective one of the first through third on-cell count values determined through the respective one of the first through third soft erase operations,
select first to third defense code parameter sets each corresponding to the respective first to third read level offsets, and
transmit first to third read commands to the respective first to third non-volatile memory devices based on the selected respective first to third defense code parameter sets such that the first to third read commands include the respective one of the first to third read level offsets.

2. The storage device of claim 1, wherein each of the first to third soft erase operations has a first operation voltage which is lower than a second operation voltage of a normal erase operation.

3. The storage device of claim 2, wherein, in the first soft erase operation, a word line level and an erase time are same for each word line of the first non-volatile memory device.

4. The storage device of claim 1, wherein the storage device is implemented on, a first chip, the first non-volatile memory device and the second non-volatile memory device being on the first chip and a second chip, the third non-volatile memory device being on the second chip,
wherein the third read level offset of the third non-volatile memory device is different from the first and second read level offsets of the first non-volatile memory device and the second non-volatile memory device.

5. The storage device of claim 1, wherein a read level offset of a first word line of the first non-volatile memory device is different from a read level offset of a second word line of the first non-volatile memory device.

6. The storage device of claim 1, wherein the storage controller is configured to
perform hard decision decoding when the first non-volatile memory device fails in data read,
extract the first on-cell count value through the first soft erase operation when the data read fails by the hard decision decoding,
adjust a first read level with the first read level offset set by the first on-cell count value, and
perform a first read-retry operation.

7. The storage device of claim 6, wherein the storage controller is configured to store environment information of the first non-volatile memory device in response to the data read passing by the first read-retry operation.

8. The storage device of claim 1, wherein
the storage controller is configured to perform soft decision decoding in response to data read failing by a read-retry operation based on any one of the first to third read commands, and
determine an uncorrectable error when the soft decision decoding fails.

9. The storage device of claim 1, wherein a read level offset of a first temperature region in the first non-volatile memory device is different from a read level offset of a second temperature region in the first non-volatile memory device.

10. The storage device of claim 1, wherein the first non-volatile memory device is configured to,
receive a first soft erase command from the storage controller, and
perform the first soft erase operation in response to the first soft erase command.

11. The storage device of claim 1, wherein the storage controller is configured to extract the respective one of first through third on-cell count values by,
performing a normal read operation on a respective one of the first through third non-volatile memory devices, in response to a host read command from a host device,
verifying whether the normal read operation on the respective one of the first through third non-volatile memory devices passes or fails using hard decision (HD) decoding, and
extracting a respective one of the first or second on-cell count values by performing soft decision (SD) decoding on the respective one of the first or second non-volatile memory devices that fail the normal read operation.

12. A storage device comprising:
a first non-volatile memory device having first health index information, the first health index information includes a first on-cell count value extracted from a reference voltage after performing a first soft erase operation on the first non-volatile memory device;
a second non-volatile memory device having second health index information, the second health index information includes a second on-cell count value extracted from a reference voltage after performing a second soft erase operation on the second non-volatile memory device; and
a storage controller including processing circuitry configured to:
generate and store the first and second health index information by,
storing the respective one of the first or second on-cell count values as the first health index information stored in the first non-volatile memory device and the second health index information stored in the second non-volatile memory device, respectively,
read first data of the first non-volatile memory device by,
determining a first read level offset based on a distribution of the first on-cell count values in the first health index information,
selecting a first defense code parameter set based on the first read level offset, and
transmitting a first read command to the first non-volatile memory device based on the first defense code parameter set such that the first read command include the first read level offset, and
read second data of the second non-volatile memory device by,
determining a second read level offset based on a distribution of the second on-cell count values in the second health index information, selecting a second defense code parameter set based on the second read level offset, and transmitting a second read command to the second non-volatile memory device based on the second defense code parameter set such that the second read command include the second read level offset, wherein the first read level offset of the first non-volatile memory device is different from the second read level offset of the second non-volatile memory device.

13. The storage device of claim 12, wherein the each of the first and second health index information includes at least one of retention prediction index information, a cell reliability factor, chip position information, program time information, read time information, a process index, or wafer size information.

14. The storage device of claim 12, wherein the storage controller receives the first or second health index information stored in a security block of the respective first non-volatile memory device or second non-volatile memory device, in response to the storage device being powered on and initialized.

15. The storage device of claim 12, wherein a first operation voltage of the first soft erase operation is lower than a second operation voltage of a normal erase operation.

16. The storage device of claim 12, wherein a read level offset of a first temperature region in the first non-volatile memory device is different from a read level offset of a second temperature region in the first non-volatile memory device.

17. The storage device of claim 12, wherein the first non-volatile memory device is on a first chip, and the second non-volatile memory device is on a second chip different from the first chip.

18. A storage device comprising:
a first non-volatile memory device and a second non-volatile memory device, the first non-volatile memory device including a first normal memory block and a first security block, the first security block storing first health index information, the first health index information including a first on-cell count value extracted from a reference voltage after performing a first soft erase operation on the first non-volatile memory device, and the second non-volatile memory device including a second normal memory block and a second security block, the second security block storing second health index information, the second health index information including a second on-cell count value extracted from a reference voltage after performing a second soft erase operation on the second non-volatile memory device; and a storage controller including processing circuitry configured to,
generate and store the first and second health index information by,
extracting a respective one of the first or second on-cell count values by performing a respective one of the first or second soft erase operations on the respective one of the first or second non-volatile memory devices, and storing the respective one of the first or second on-cell count values as the first health index information stored in the first non-volatile memory device and the second health index information stored in the second non-volatile memory device, respectively, read data of the first non-volatile memory device by,
determining a first read level offset based on a distribution of the first on-cell count values in the first health index information, selecting a first pre-defined read level offset table (PDT) based on the first read level offset, and transmitting a first read command to the first non-volatile memory device based on the first PDT such that the first read command include the first read level offset, and read data of the second non-volatile memory device by,
determining a second read level offset based on a distribution of the second on-cell count values in the second health index information, selecting a second pre-defined read level offset table (PDT) based on the second read level offset, and transmitting a second read command to the second non-volatile memory device based on the second PDT such that the second read command include the second read level offset.

19. The storage device of claim 18, wherein the first non-volatile memory device and the second non-volatile memory device are on different chips, and
a read level offset set of the first PDT is different from a read level offset set of the second PDT.

20. The storage device of claim 18, wherein a read level offset of a first state of the first PDT has a different value from a read level offset of a second state of the first PDT.

* * * * *